(12) United States Patent
Moon

(10) Patent No.: US 7,038,653 B2
(45) Date of Patent: May 2, 2006

(54) SHIFT RESISTER AND LIQUID CRYSTAL DISPLAY HAVING THE SAME

(75) Inventor: Seung-Hwan Moon, Yongin-si (KR)

(73) Assignee: Samsung Electronics., Co., Ltd., Kyungki-do (KR)

( * ) Notice: Subject to any disclaimer, the term of this patent is extended or adjusted under 35 U.S.C. 154(b) by 341 days.

(21) Appl. No.: 10/454,331

(22) Filed: Jun. 4, 2003

(65) Prior Publication Data

US 2004/0046729 A1    Mar. 11, 2004

(30) Foreign Application Priority Data

Sep. 5, 2002    (KR) .................... 10-2002-0053634

(51) Int. Cl.
*G09G 3/36*    (2006.01)
(52) U.S. Cl. .................. 345/100; 345/98; 345/559; 377/64; 377/81
(58) Field of Classification Search ............ 345/98, 345/100, 559; 377/64, 81; 365/78, 80–93
See application file for complete search history.

(56) References Cited

U.S. PATENT DOCUMENTS 5,859,630 A * 1/1999 Huq ........................... 345/100
6,300,928 B1 * 10/2001 Kim ........................... 345/92

* cited by examiner

*Primary Examiner*—Sumati Lefkowitz
*Assistant Examiner*—Ke Xiao
(74) *Attorney, Agent, or Firm*—F. Chau & Associates, LLC

(57) ABSTRACT

In a shift register and an LCD having the same, the shift register includes stages having odd stages for receiving a first clock signal and even stages for receiving a second clock signal and all stages receive a control signal. Each of the stages includes a pull-up section for providing one of first and second clock signals to an output terminal, a pull-down section for providing a first power voltage to the output terminal, a pull-up driving section for turning on/off the pull-up section in response to the control signal, a first pull-down driving section for outputting a second control signal, and a second pull-down driving section for turning off the pull-down section in response to the input signal and turning on the pull-down section in response to the second control signal.

20 Claims, 15 Drawing Sheets

SHIFT RESISTER AND LIQUID CRYSTAL DISPLAY HAVING THE SAME

CROSS-REFERENCE TO RELATED APPLICATION

This application relies for priority upon Korean Patent Application No. 2002-53634 filed on Sep. 5, 2002, the contents of which are herein incorporated by reference in its entirety.

BACKGROUND OF THE INVENTION

1. Field of the Invention

The present invention relates to a shift register and a liquid crystal display (LCD) having the same, and more particularly to a shift register for improving reliability and life span thereof and a liquid crystal display having the same.

2. Description of the Related Art

In these days, information processing devices have been rapidly developed in a trend with various architectures, functions and faster information processing speed. Information processed in those information-processing devices has an electrical signal format. In order to visually confirm information processed in the information-processing device, a display for a role as an interface should be provided.

LCDs have advantages such as the lighter weight, small size, high resolution, lower power consumption and friendly relation with environment and they render display of full colors compared with the traditional cathode ray tube (CRT). Such the advantages allow the LCDs to replace the CRTs and to be spotlighted as a next generation display.

LCDs apply an electric power to liquid crystal having a specific molecular configuration to vary the molecular arrangement of liquid crystal. The variation in the molecular configuration of liquid crystal causes a variation in optical properties such as birefringence, optical rotary power, dichroism, light scattering. The LCDs utilize such variations in optical properties to display an image.

The LCD device is largely classified into a TN (Twisted Nematic) type and a STN (Super-Twisted Nematic) type. The liquid crystal display device is, according to the driving method, classified into an active matrix display type, which uses a switching device and a TN liquid crystal, and a passive matrix type, which uses an STN liquid crystal.

A distinguishable difference of two types is in that the active matrix display type is applied to a TFT-LCD that drives the LCD by using a TFT and the passive matrix display type dispenses with a complicated circuit associated with a transistor because of using no transistor TFT-LCD is divided into amorphous silicon TFT LCD (a-Si TFT-LCD) and polycrystalline silicon TFT LCD (poly-Si TFT-LCD). Poly-Si TFT-LCD has advantages of lower power consumption, lower price compared with a-Si TFT-LCD but has a drawback in that its manufacturing process is complicated. Thus, poly-Si TFT-LCD is mainly used in a small sized display such as mobile phones.

Amorphous-Si TFT-LCD is applied to a large screen sized display such as notebook personal computer (PC), LCD monitor, high definition (HD) television, etc., due to easy application of large screen and high production yield.

FIG. 1 is a simplified schematic view showing a conventional TFT substrate in a poly-TFT LCD. FIG. 2 is a simplified schematic view showing a conventional TFT substrate in an amorphous-TFT LCD.

As shown in FIG. 1, the poly-Si TFT LCD includes a data driving circuit 12 and a gate driving circuit 14 disposed on a glass substrate 10 having a pixel array. A terminal part 16 is connected to an integrated printed circuit board (PCB) 20 by using a film cable 18. Those structures may save the manufacturing costs of products, minimize the power-loss due to the integration of driving circuits and provide a display device having a slim design.

However, as shown in FIG. 2, a-Si TFT LCD has a data driving chip 34 formed on a flexible PCB 32 in a manner of COF (Chip-On-Film). A data PCB 36 is connected to a data line terminal of the pixel array through the flexible PCB 32. A gate driving chip 40 is formed on a flexible PCB 38 in the manner of forming a COF. A gate PCB 42 is connected to a gate line terminal through the flexible PCB 38.

That is, a-Si TFT LCD has disadvantages such as high cost and large size in aspects of cost and structure in comparison with those of poly-Si TFT LCD.

BRIEF SUMMARY OF THE INVENTION

The present invention provides a shift register for improving reliability and life span of an a-Si TFT LCD.

The present invention provides an LCD having the above shift resister.

In one aspect of the invention, a shift register includes plural stages connected one after another to each other. The plural stage includes a first stage in which a start signal being coupled to an input terminal and the shift register sequentially outputs output signals of each of the stages. The plural stages include odd stages for receiving a first clock signal and even stages for receiving a second clock signal having a phase opposite to the first clock signal and all stages receive a control signal for outputting resectively clock signal.

Each of the plural stages includes a pull-up means for providing a corresponding one of the first and second clock signals to an output terminal, a pull-up driving means connected to an input node of the pull-up means, for turning on the pull-up means in response to a front edge of an output signal of a front stage and turning off the pull-up means in response to a front edge of the first and second control signals, a pull-down means for providing a first power voltage to the output terminal, a first pull-down driving means connected to an input node of the pull-up means, for outputting a second control signal in response to turn-on of the pull-up means, and a second pull-down driving means connected to an input node of the pull-down means, for turning off the pull-down means in response to a front edge of an input signal and turning on the pull-down means in response to the second control signal.

In another aspect of the invention, an LCD includes a display cell array circuit, a data driving circuit and a gate driving circuit formed on a transparent substrate. The display cell array circuit includes plural data lines and plural gate lines and each of the display cell arrays is connected to a corresponding pair of data line and gate line.

The gate driving circuit includes a shift register including plural stages connected one after another to each other. The plural stages include a first stage in which a start signal is being coupled to an input terminal and the shift register sequentially outputs output signals of each of the stages. The plural stages include odd stages for receiving a first clock signal and even stages for receiving a second clock signal having a phase opposite to the first clock signal and all stages received a control signal for outputting respectively clock signals.

Each of the plural staged includes a pull-up means for providing a corresponding one of the first and second clock signals to an output terminal, a pull-up driving means connected to an input node of the pull-up means, for turning on the pull-up means in response to a front edge of an output signal of a front stage and turning off the pull-up means in response to a front edge of the first and second control signals, a pull-down means for providing a first power voltage to the output terminal, a first pull-down driving means connected to an input node of the pull-up means, for outputting a second control signal in response to turn-on of the pull-up means, and a second pull-down driving means connected to an input node of the pull-down means, for turning off the pull-down means in response to a front edge of an input signal and turning on the pull-down means in response to the second control signal.

According to the present invention, a channel width difference of transistors applied to the pull-down driving means may be reduced. Also, the present invention may prevent a flow of an overcurrent through the sixth transistor M6, which is being operated at a high temperature, thereby preventing the transistor from being deteriorated.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE PREFERRED EMBODIMENT

Figure 1:
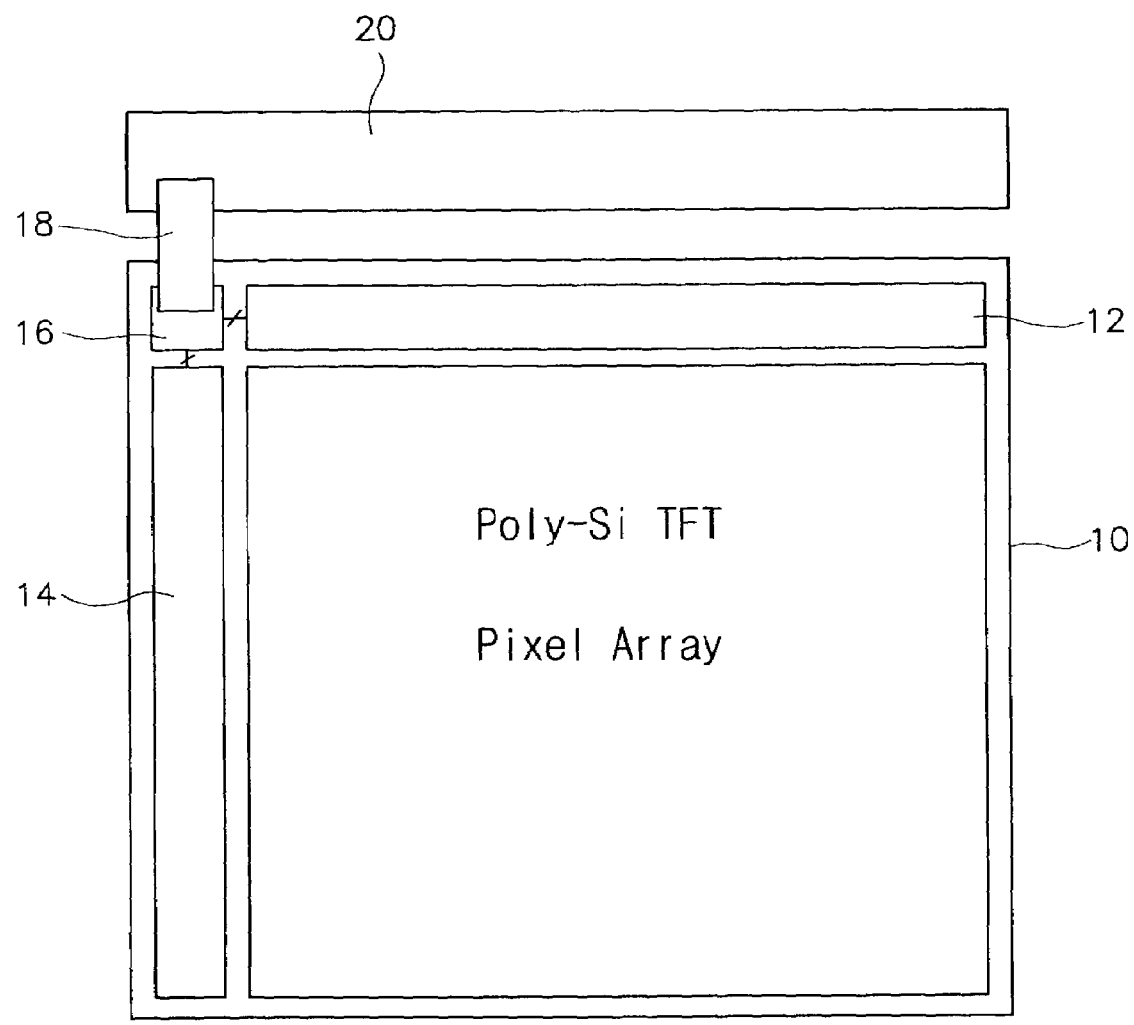
FIG. 1 is a simplified schematic view showing a conventional TFT substrate in a poly-TFT LCD.
Figure 2:
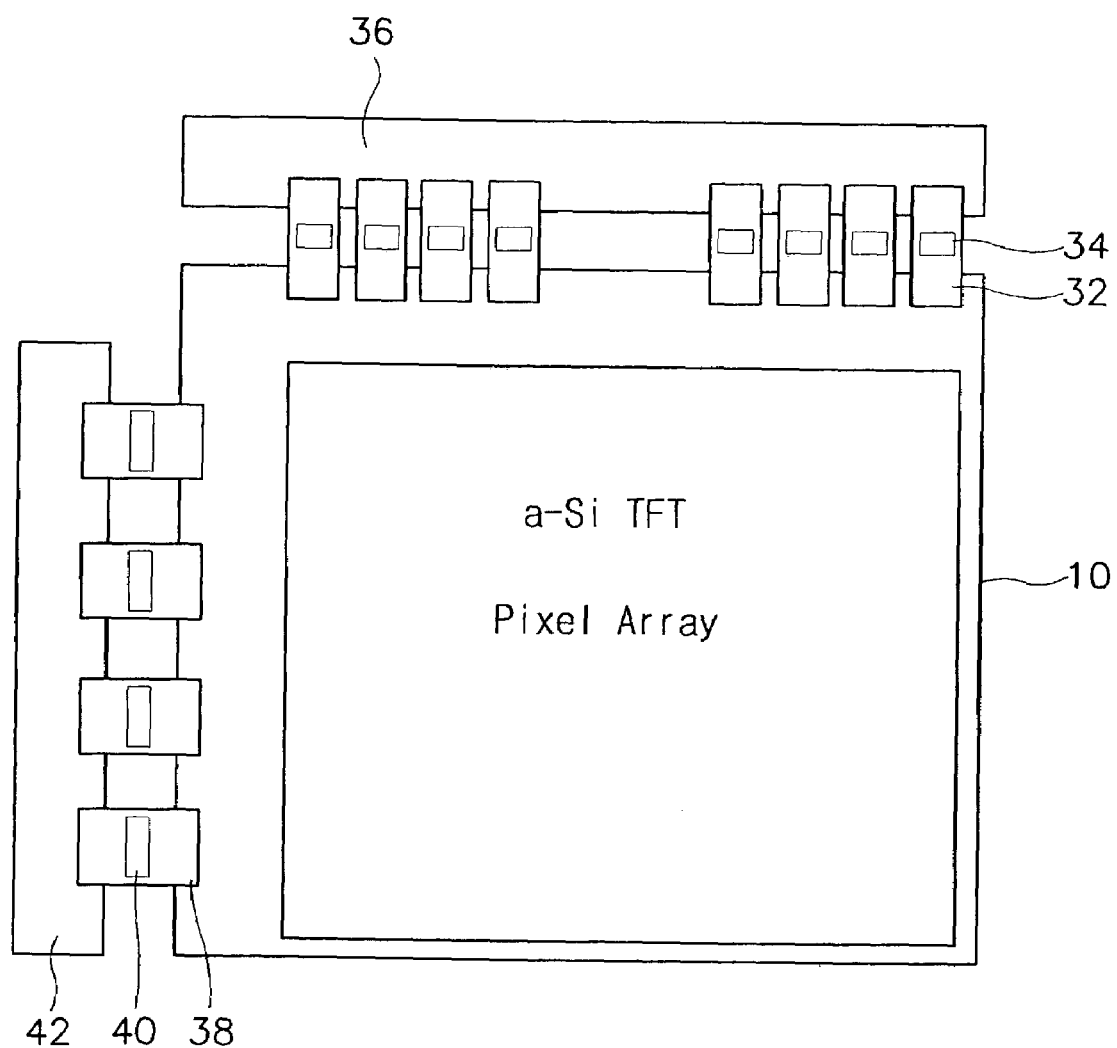
FIG. 2 is a simplified schematic view showing a conventional TFT substrate in an amorphous-TFT LCD.
Figure 3:
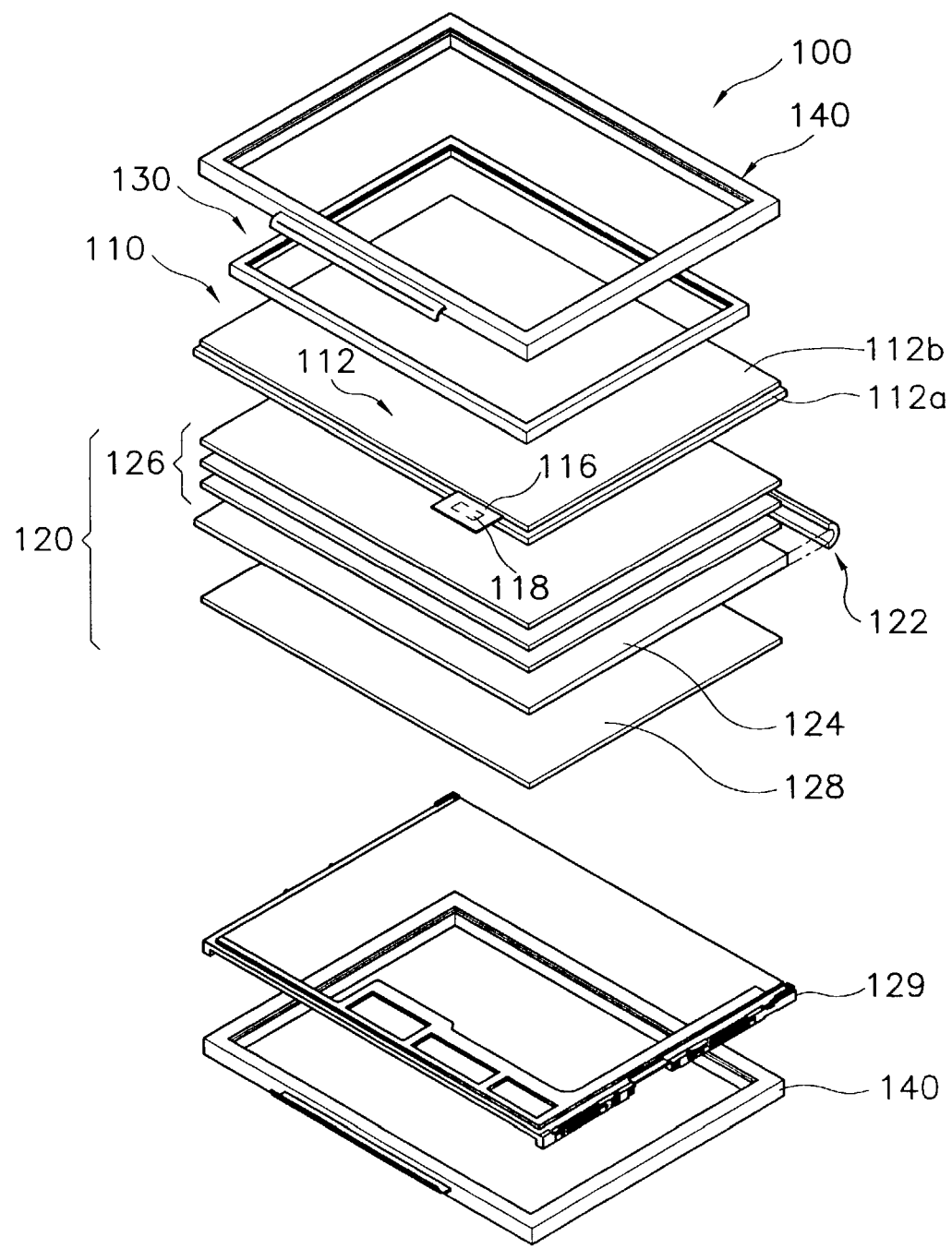
FIG. 3 is a disassembled perspective view showing an amorphous-Si TFT LCD in accordance with an exemplary embodiment of the present invention.

FIG. 3 is a disassembled perspective view showing an amorphous-Si TFT LCD in accordance with an exemplary embodiment of the present invention.

Referring to FIG. 3, an LCD 100 includes an LCD panel assembly 110, a backlight assembly 120, a chassis 130 and a cover 140.

The LCD panel assembly 110 includes an LCD panel 112, a flexible PCB 116 and an integral control and data driving chip 118. The LCD panel 112 includes a TFT substrate 112a and a color filter substrate 112b. On the TFT substrate 112a, a display cell array circuit, a data driving circuit, a gate driving circuit and an external connection terminal are disposed. Color filters and transparent common electrodes are disposed on the color filter substrate 112b. The TFT substrate 112a faces the color filter substrate 112b. Liquid crystal is injected between the TFT substrate 112a and the color filter substrate 112b, and an injection inlet of liquid crystal is then sealed.

The integral control and data driving chip 118 mounted on the flexible PCB 116 is connected with circuits disposed on the TFT substrate 112a through the flexible PCB 116. The flexible PCB 116 provides the data driving circuit and the gate driving circuit of the TFT substrate 112a with data signals, data timing signals, gate timing signals and gate driving voltages.

The backlight assembly 120 includes a lamp assembly 122, a light guiding plate 124, a series of optical sheets 126, a reflector plate 128 and a mold frame 129.

Figure 4:
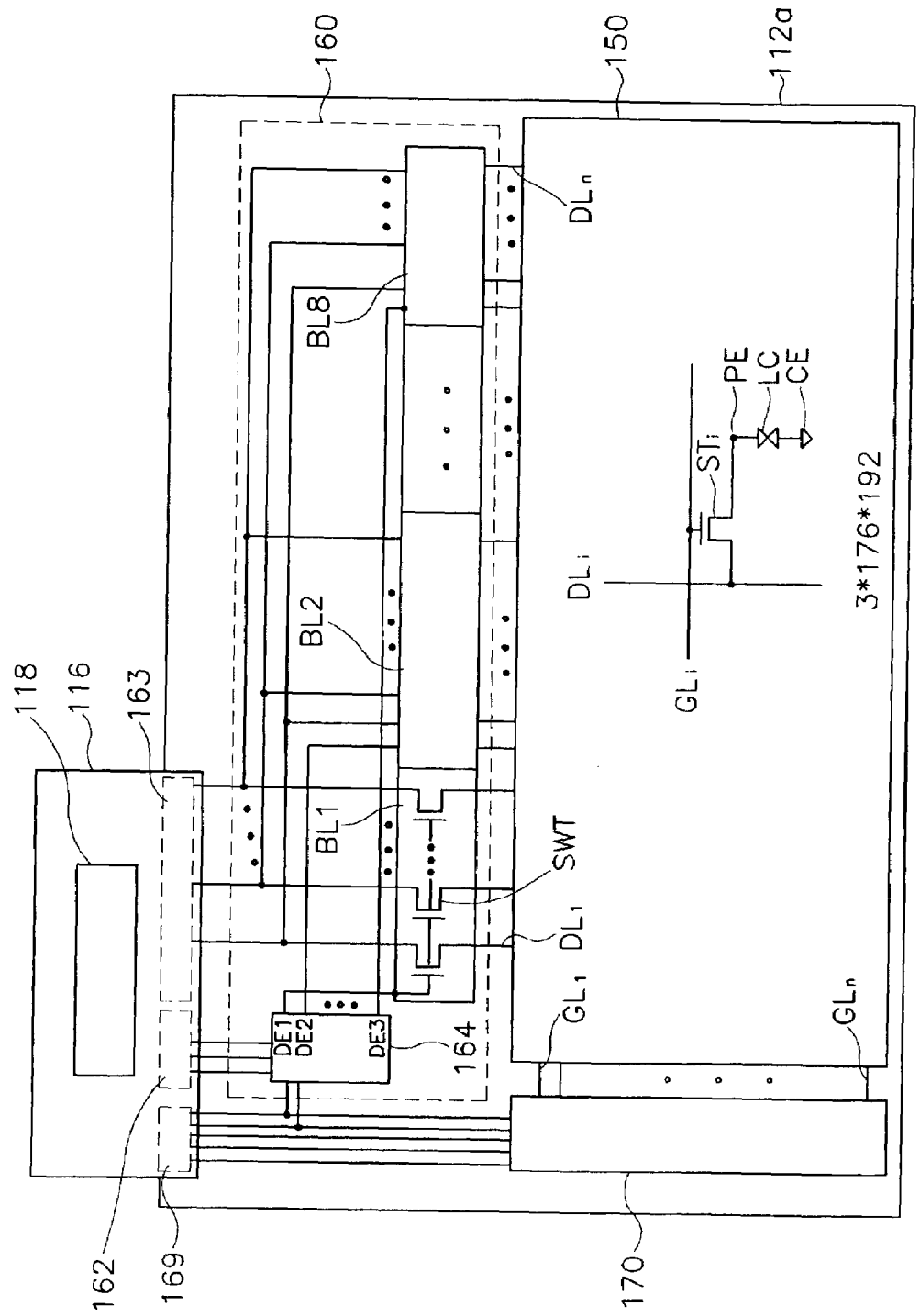
FIG. 4 is a schematic view showing a TFT substrate in an amorphous-Si TFT LCD in accordance with an exemplary embodiment of the present invention.

FIG. 4 is a schematic view showing a TFT substrate in an amorphous-Si TFT LCD in accordance with an exemplary embodiment of the present invention.

Referring to FIG. 4, a display cell array circuit 150, a data driving circuit 160, a gate driving circuit 170, an external connection terminal 162 and 163 for the data driving circuit 160, an external connection terminal 169 for the gate driving circuit 170 are formed on the TFT substrate 112a, which are formed during the formation of TFTs.

The display cell array circuit 150 includes an m-number of data lines DL1-DLm extended along the column direction and an n-number of gate lines GL1-GLn extended along the row direction.

In one exemplary embodiment of the present embodiment, an example of 2 inches-LCD panels having a resolution of 525 (i.e., (176×3)×192) corresponding to numbers of the gate lines and data lines is provided.

Switching transistors ST are formed at the cross points of the data lines and the data lines. Each of switching transistor STi has a drain connected to a data line DLi and a gate connected to a gate line GLi. Source of the switching transistor STi is connected to a transparent pixel electrode PE. Liquid crystal LC is arranged between the transparent pixel electrode PE and a transparent common electrode CE.

Thus, a voltage applied between the transparent pixel electrode PE and the transparent common electrode CE controls the alignment of liquid crystal molecules, thus light amount passing through the liquid crystal molecules is controlled and thereby gray scales for respective pixels are displayed.

The data driving circuit 160 includes a shift register 164 and 528 switching transistors SWT. The 528 switching transistors SWT form eight data line blocks BL1–BL8 per sixty-six switching transistors.

In any data line block BLi, sixty-six input terminals are commonly connected to an external input terminal 163 consisting of sixty-six data input terminals and sixty-six output terminals are connected to the corresponding sixty-six data lines. Also, a block selection terminal is connected to a corresponding one-output terminal of eight output terminals of the shift register 164.

The 528 switching transistors SWT is comprised of a-Si TFT MOS transistor of which source is connected to corresponding data line, drain is connected to a corresponding input terminal among 66 number of data input terminals, and gate is connected to block selection terminal.

Accordingly, 528 data lines are divided into eight blocks each having sixty-six data lines and the eight blocks are each selected sequentially by eight block selection signals.

The shift register 164 receives a first clock signal ("CKH"), a second clock signal ("CKHB") and a block selection start signal ("STH"). The output terminals of the shift register 164 are connected to the block selection terminals of corresponding lines blocks.

Figure 5:
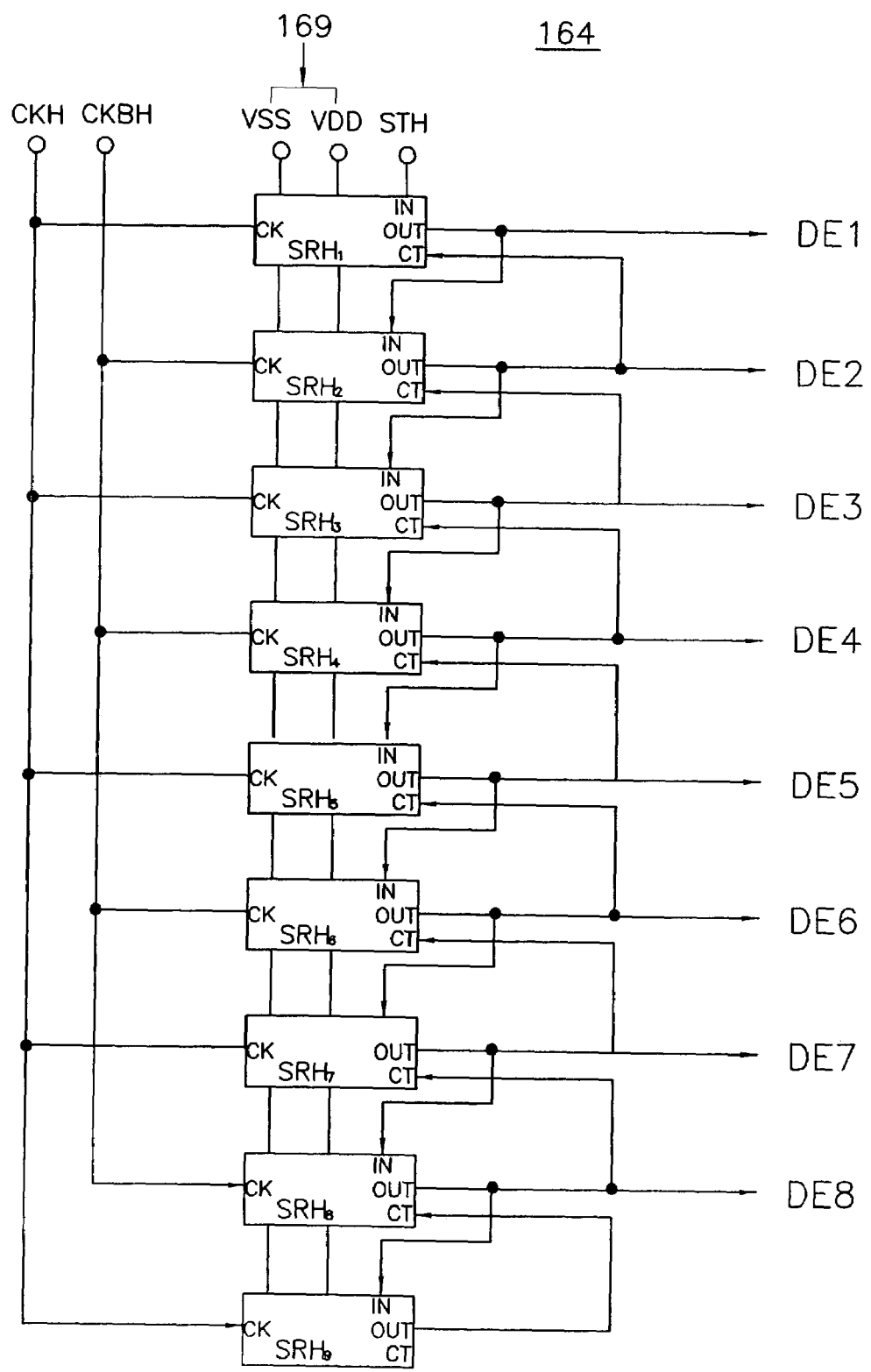
FIG. 5 is a block diagram showing a shift register in the data driving circuit shown in FIG. 4.

FIG. 5 is a block diagram showing a shift register in the data driving circuit shown in FIG. 4.

Referring to FIG. 5, the shift register 164 includes nine stages SRH1 to SRH9 subordinated to one after another. In other words, the output terminal "OUT" of each stage is connected to the input terminal "IN" of the next stage. The nine stages have eight stages SRH1 to SRH8 corresponding to data line blocks and one dummy stage SRH9. Each stage has an input terminal IN, an output terminal OUT, a control terminal "CT", a clock signal input terminal "CK", a first power voltage terminal "$V_{OFF}$" and a second power voltage terminal "VDD". The eight stages SRH1 to SRH8 provide the block selection terminals of respective data line blocks BL1 to BL8 with the block selection start signals DE1 to DE8, respectively. The block selection start signals are the enable signals for respective line blocks.

Odd stages SRH1, SRH3, SRH5, SRH7, SRH9 receive the first clock signal "CKH" and even stages SRC2, SRC4, SRH6, SRH8 receive the second clock signal. The first clock signal CKH and the second clock signal CKHB have a phase opposite to each other. Duty periods of the first and second clock signals CKH and CKHB are set to be less than 1/66 ms.

The output signal of the next stage to a present stage is input to the control terminal CT of the present stage as a control signal. In other words, the control signal that is inputted to the control terminal CT is delayed by the duty period of the output signals itself.

Thus, since the output signals of respective stages are sequentially generated with active period of high state, data line blocks corresponding to active periods of respective output signals are selected and become enable.

Dummy stage SRH9 is used for providing the control terminal CT of the previous stage SRH8 with a control signal.

Figure 6:
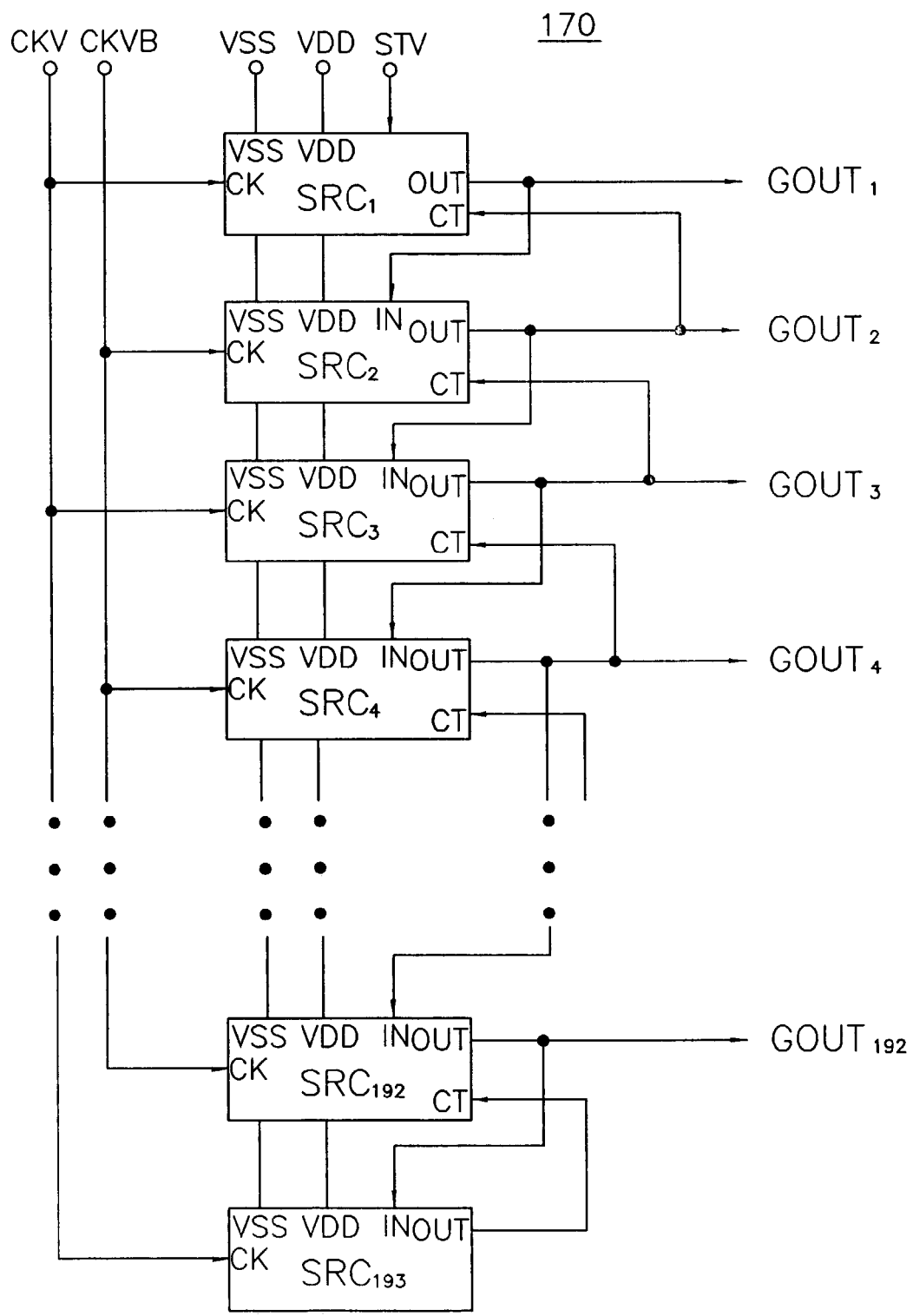
FIG. 6 is a block diagram of a shift register in the gate driving circuit shown in FIG. 4.

FIG. 6 is a block diagram of a shift register in the gate driving circuit shown in FIG. 4.

Referring to FIG. 6, the gate driving circuit 170 has a single shift register. The shift register 170 of FIG. 6 includes plural stages SRC1 to SRC4 subordinated to one after another. In other words, the output terminal "OUT" of each stage is connected to the input terminal IN of the next stage. The stages have 192 stages SRC1 to SRC192 corresponding to gate lines and one dummy stage SRC193. Each stage has an input terminal IN, an output terminal OUT, a control terminal CT, a clock signal input terminal CK, a first power voltage terminal VSS and a second power voltage terminal VDD.

Figure 7:
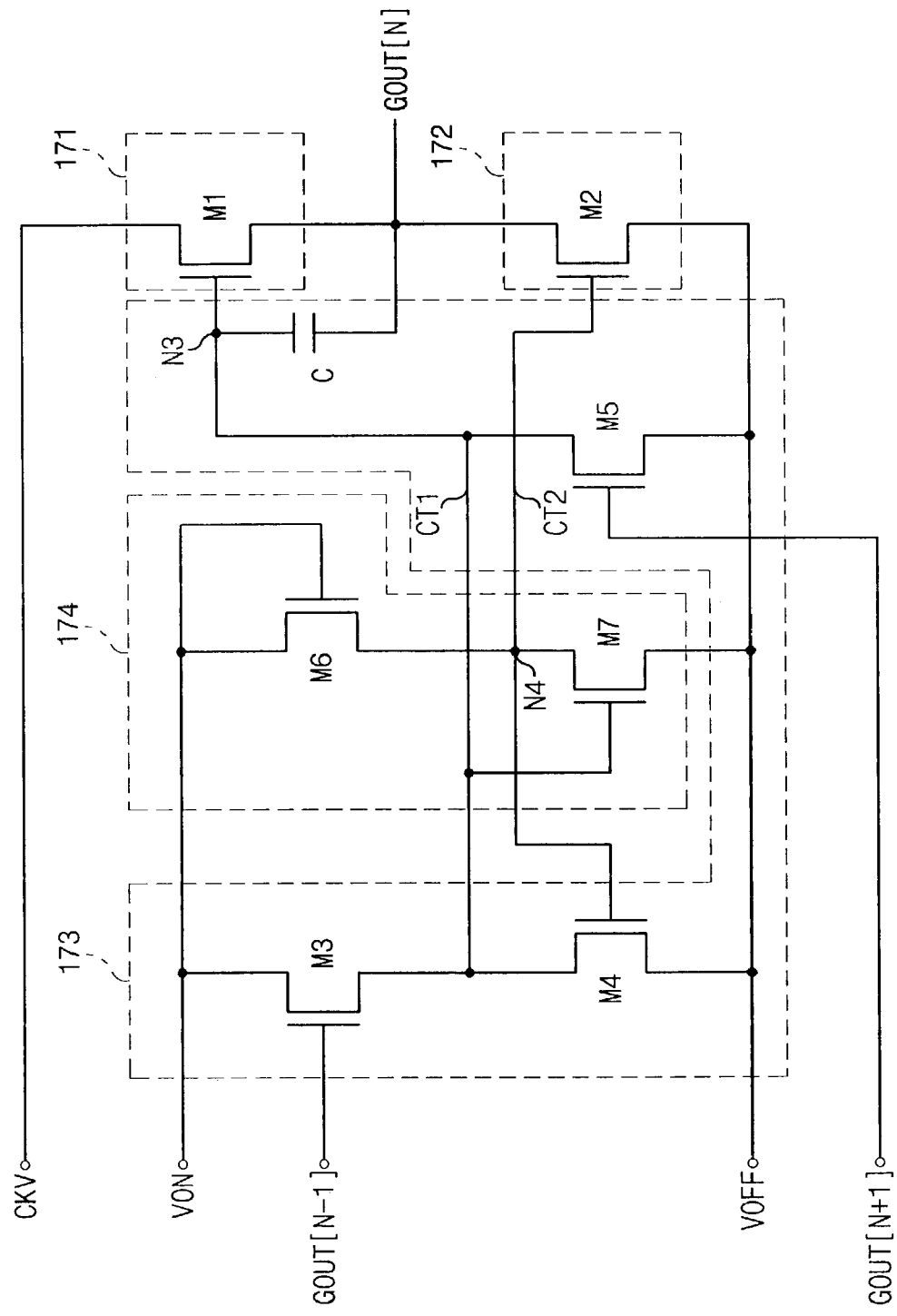
FIG. 7 is a detailed circuit diagram of each stage in the shift registers in accordance with an exemplary embodiment of the present invention.

To the input terminal "IN" of the first stage is input a start signal "ST" as illustrated in FIG. 7. Here, the start signal is a pulse signal synchronized with a vertical synchronous signal.

Output terminals GOUT1 to GOUT192 of respective stages are connected to respective corresponding gate lines. To odd stages SRC1, SRC3, etc. is supplied the first clock CKV and to even stages SRC2, SRC4, etc. is supplied the second clock CKVB. The first clock CKV has an opposite phase to the second clock CKVB. The first and second clock CKV and CKVB have a duty period of 16.6/192 ms.

The output signals GOUT2, GOUT3 and GOUT4 of the next stages SRC2, SRC3, SRC 4, etc. to present stages SRC1, SRC2, SRC3, etc. are input to the control terminal CT of the present stages SRC1, SRC2, SRC3, etc. as a control signal. In other words, the control signal that is inputted to the control terminal CT is delayed by the duty period of the output signals itself.

Thus, since the output signals of respective stages are sequentially generated with active period of high state, horizontal lines corresponding to active periods of respective output signals are selected.

Figure 8:
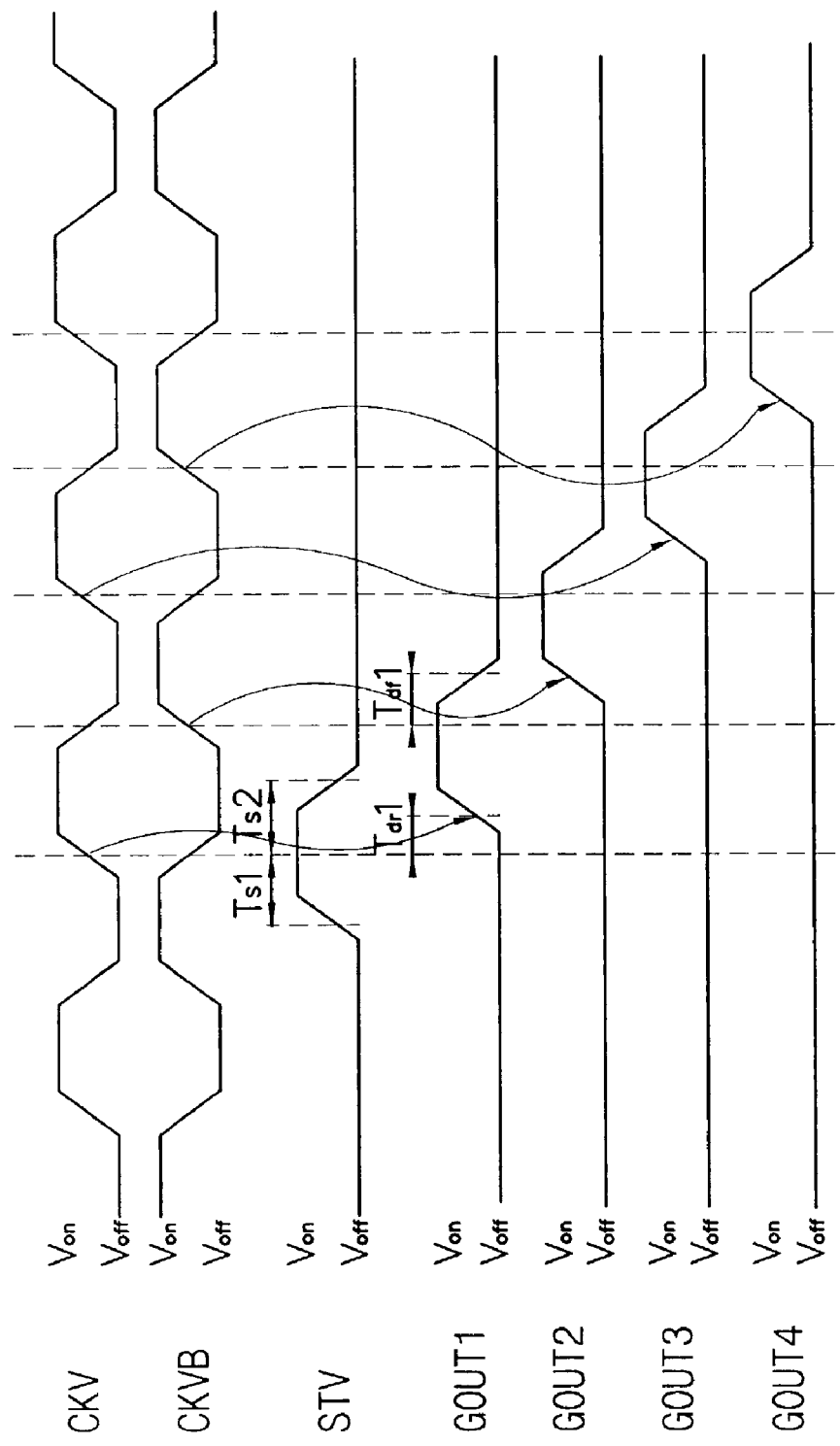
FIG. 8 is a timing diagram of respective elements of FIG. 7.

FIG. 7 is a detailed circuit diagram of each stage in the shift registers in accordance with an exemplary embodiment of the present invention. Particularly, a concrete circuit constitution of each stage of shift resisters of FIG. 6 is described therein. FIG. 8 is a timing diagram of respective elements of FIG. 7.

Referring to FIG. 7, each stage of the shift register 170 includes a pull-up section 171, a pull-down section 172, a pull-up driving section 173 and a pull-down driving section 174.

The pull-up section 171 includes a first NMOS transistor M1 of which drain is connected to a power clock input terminal CKV, gate is connected to the third node N3 and source is connected to an output terminal GOUT [N].

The pull-down section 172 includes a second NMOS transistor M2 of which drain is connected to a output terminal GOUT [N], gate is connected to the fourth node N4 and source is connected to a first power voltage $V_{OFF}$.

The pull-up driving section 173 includes a capacitor C and third to fifth NMOS transistor M3 to M5. The capacitor C is connected between the third node N3 and the output terminal GOUT [N]. The third NMOS transistor M3 has a drain connected to the second power voltage $V_{ON}$, a gate connected to an input terminal, that is, to output signal GOUT [N–1] of the front stage, and a source connected to the third node N3. The fourth NMOS transistor M4 has a drain connected to the third node N3, a gate connected to the fourth node N4, and a source connected to the first power voltage $V_{OFF}$. The fifth NMOS transistor M5 has a drain connected to the third node N3, a gate connected to the fourth node N4, a source connected to the first power voltage $V_{OFF}$. The third NMOS transistor NT3 has a size larger than that of the fifth NMOS transistor NT5, for example, has a size ratio of 2:1.

The pull-down driving section 174 includes sixth and seventh NMOS transistors M6 and M7. The sixth NMOS transistor M6 has a drain and gate commonly connected to the second power voltage $V_{ON}$ and a source connected to the fourth node N4. The seventh NMOS transistor M7 has a drain connected to the fourth node N4, a gate connected to the third node N3 and a source connected to the first power voltage $V_{OFF}$. The sixth NMOS transistor M6 has a size ratio of 1:16 to the seventh NMOS transistor M7.

As shown in FIG. 8, as first and second power clocks CKV and CKVB and scan start signal ST are supplied to the shift register 170, the first stage SRC1 delays a high level period of the first power clock CKV in response to the front edge of the scan start signal ST for a predetermined time period of Tdr1 to thereby output a delayed output signal GOUT1.

As described above, the first and second power clocks CKV and CKVB and the scan start signal ST are supplied to the shift register 170 on the glass, that is arranged on an array substrate, so as to drive the shift register 170 as a gate driving circuit.

Figure 9:
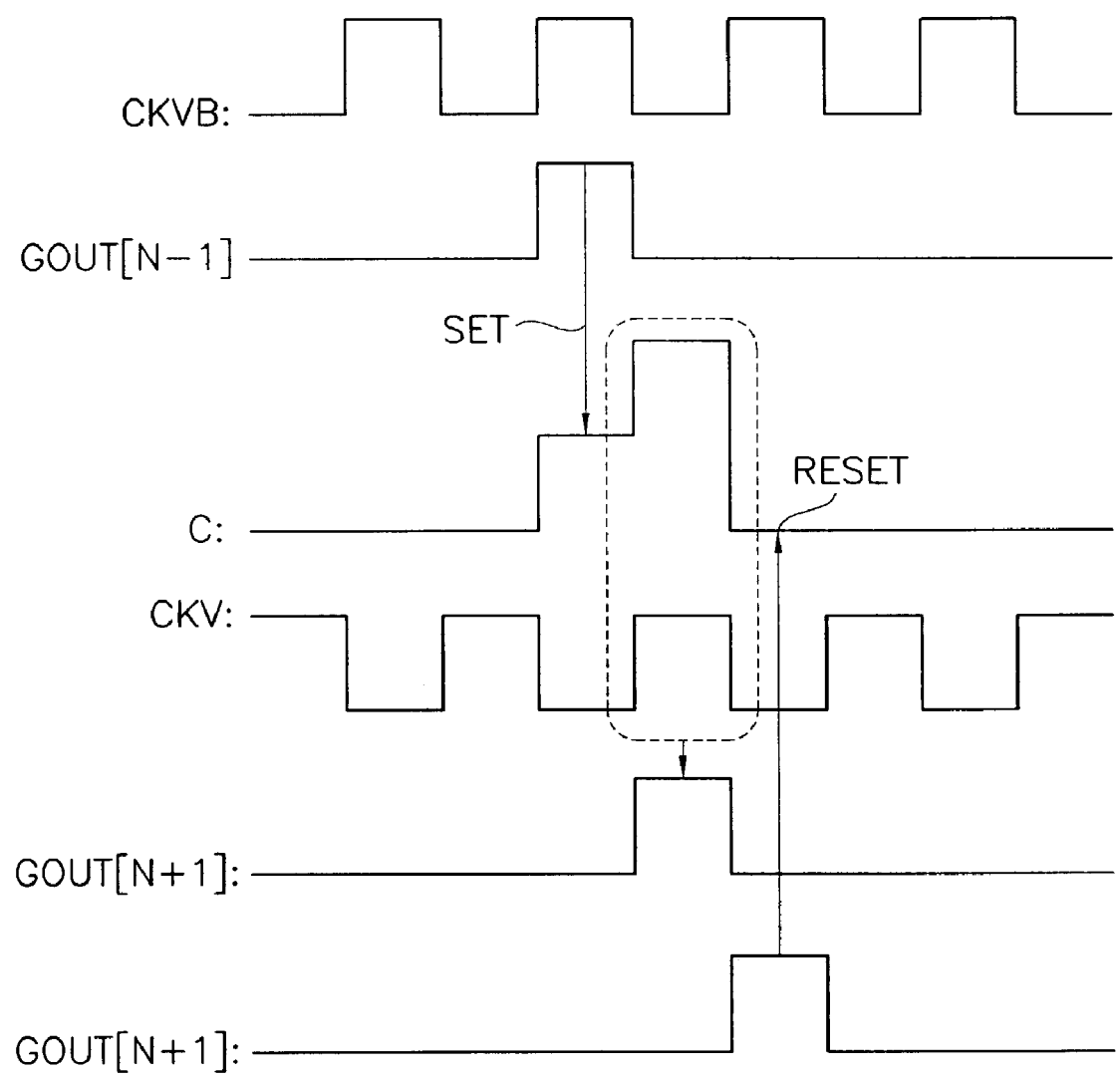
FIG. 9 is a driving waveform simulated at respective stage of FIG. 6.

FIG. 9 is a driving waveform simulated at respective stages of FIG. 6.

Referring to FIG. 9, the shift resister 170 receives either the first power clock CKV or the second power clock CKVB having a phase opposite to that of the first power clock CKV in a cycle of 2H and sequentially outputs plural gate signals GOUT1, GOUT2, GOUT3, etc. to the gate lines of the TFTs. The first and second power clocks CKV and CKVB are amplified to have an amplitude of a signal outputted from timing controller (not shown), which is from about 0 to about 3 volts, for example, from about −8 to about 24 volts.

However, as the LCD panel having resolution of 525 (176*3)*192, in a case where the shift resister 170 is used as the gate driving circuit, the shifter resister 170 is suitable for adopting to small or middle-sized monitor and not suitable for adopting to large-sized monitor having high resolution.

This is because the size of each transistor M1/M2, that is performing functions of a pull-up/pull-down, increases in order to apply the shift resister to the gate lines of the large-sized monitor. That is, the shift resister is difficult to be integrated into a predetermined space.

Thus, the size of pull-up/pull-down transistors M1/M2, that is not suitable for sufficiently driving the gate lines, the variation of threshold voltage $V_{th}$ of the TFTs and the temperature characteristic of the amorphous silicon are remarkably different in comparison with those of the poly-crystalline or single-crystalline silicon, thereby deteriorating the reliability and production yield.

Hereinafter, the problem of reliability, that is generated when the shift resister 170 is adopted for a the gate driver of the LCD using an a-Si TFT, will be described with reference to FIG. 7.

Referring to FIG. 7, the inverter 174 includes the sixth transistor M6 that maintains turn-on state at all the times and the seventh transistor M7 that turns on or off in response to the voltage CT1. When the seventh transistor M7 of the inverter 174, the voltage CT2 is represented by the following equation (1).

$$CT2_{high} = V_{ON} - V_{th(M6)} \quad (1)$$

Meanwhile, as representing by the following equation (2), when the seventh transistor M7 is turned on, the voltage CT2 is decided according to the resistance ratio between the sixth and seventh transistors M6 and M7 while the sixth and seventh transistors M6 and M7 are turned on.

$$CT2_{low} = \{V_{ON} - V_{th(M6)} - V_{OFF}\} * Ron_{(M7)} / \{Ron_{(M7)} + Ron_{(M6)}\} + V_{OFF} \quad (2)$$

As shown in FIG. 7, the second and fourth transistors M2 and M4 are controlled by the voltage $CT2_{low}$. If a potential value of the $CT2_{low}$ is not sufficiently low, the second and fourth transistors M2 and M4 may not be normally turned off, so that the shift resister may be in a serious misoperation.

Thus, $Ron_{(M7)}/Ron_{(M6)}$ has to be sufficiently low in the above equation (2). Also, the voltage difference between the voltage of $CT2_{low}$ as the gate voltage of each transistor and the first power voltage $V_{OFF}$ as a source voltage has to be lower than the threshold voltage $V_{th}$ of the transistor as representing by the following equation (3). So, regulating this again, this is represented by the following equation (4).

$$CT2_{low} - V_{OFF} V_{th} = V_{th(M6)} = V_{th(M1)} = V_{th(M7)} \quad (3)$$

$$CT2_{low} - V_{OFF} = (V_{ON} - V_{th} - V_{OFF}) * Ron_{(M7)} / \{Ron_{(M7)} + Ron_{(M6)}\} V_{th} \quad (4)$$

Regulating the above equation (4), the resistance ratio $Ron_{(M7)}/Ron_{(M6)}$ between the seventh transistor M7 and the sixth transistor M6, that are being turned on, is represented by the following equation (5).

$$Ron_{(M7)}/Ron_{(M6)} V_{th}/\{(V_{ON} - 2*V_{th} - V_{OFF})\} \quad (5)$$

For example, in case that the first power voltage $V_{OFF}$, the second power voltage $V_{ON}$ and the threshold voltage $V_{th}$ of the TFT are −7V, 22V and 1.7V, respectively, the resistance ratio $Ron_{(M7)}/Ron_{(M6)}$ between the seventh transistor M7 and the sixth transistor M6, that are being turned on, is represented by the following equation (6).

$$Ron_{(M7)}/Ron_{(M6)} 1.7/\{22 - 2*1.7 - (-7)\} \frac{1}{15} \quad (6)$$

As represented by the above equation (6), the pull-down driving section 174, that is performing functions of the inverter 174 must have a transistor combination such that the resistance ratio $Ron_{(M7)}/Ron_{(M6)}$ between the seventh transistor M7 and the sixth transistor M6 being turned on is smaller than a resistance ratio of 1:15.

In the above equation (6), supposing that the voltage Vgs7 between the gate and the source of the seventh transistor M7 is $V_{ON} - V_{OFF}$ while the seventh transistor M7 is turned on, $CT2_{low}$ is equal to $V_{th} + V_{OFF}$ and the voltage Vgs6 between the gate and the source of sixth transistor M6 is equal to $V_{ON} - (V_{th} + V_{OFF})$. Thus, the voltage Vgs7 between the gate and the source of seventh transistor M7 is defined as about the voltage Vgs6 between the gate and the source of the sixth transistor M6 because of disregarding the threshold voltage $V_{th}$ in respect to the voltage Vgs7 having $V_{ON} - V_{OFF}$.

In this exemplary embodiment, in case that channel lengths L of the transistors applied to the pull-down driving section 174 are the same, if a ratio of a channel width $W_{(M7)}$ of the seventh transistor M7 to a channel width $W_{(M6)}$ of sixth transistor M6 is more than 15:1, the condition of the above equation (6) is satisfied.

Meanwhile, in the TFT-LCD module, the size of the TFT, the values of first and second power voltages $V_{OFF}$ and $V_{ON}$ are fixedly applied by means of hardware. In this case, the reliability of the inverter 174 of shift resister 170 for the gate driver may be deteriorated, which is applied to the a-Si TFT LCD shown in FIG. 7. That is, the shift resister 170 for the gate driver shown in FIG. 7 may be sensitive to the temperature and the voltage and shortened in the life span thereof.

In general, the temperature is in inverse proportion to the threshold voltage of TFT.

Figure 10:
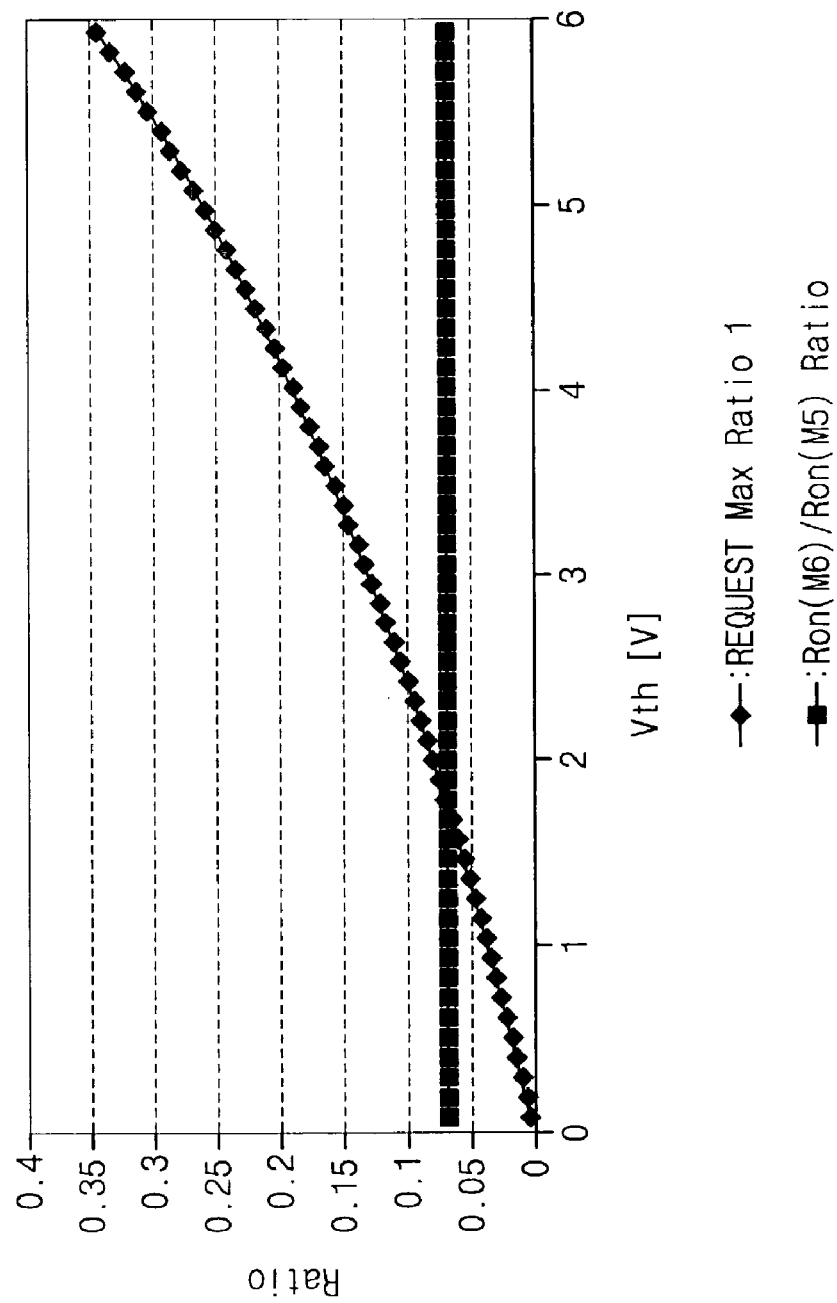
FIG. 10 is a schematic view showing a relation between a size of transistor and a threshold voltage thereof applied to a pull-down driving section of FIG. 7.

FIG. 10 is a schematic view showing a relation between a size of transistor and a threshold voltage thereof applied to a pull-down driving section of FIG. 7. Especially, FIG. 10 shows the resistance ratio ($Ron_{(M7)}/Ron_{(M6)}$) between the seventh transistor M7 and the sixth transistor M6 while the seventh and the sixth transistors M7 and M6 are turned on, which are demanded according to the threshold voltage of the inverter 174 of shift resister 170 for gate driver of a-Si TFT designed by the above equation (6).

Referring to FIG. 10, in a condition that the threshold voltage is required to have a ratio smaller than $Ron_{(M7)}/$ $Ron_{(M6)}=1/15(0.067)$, the shift resister 170 shown in FIG. 7 may be misoperated because the second transistor M2 and the fourth transistor M4 are not turned off sufficiently.

In addition, when the first power voltage $V_{OFF}$ and the second power voltage $V_{ON}$ have a little change, the shift resister 170 may be misoperated because the first power voltage $V_{OFF}$ and the second power voltage $V_{ON}$ are sensitive to the temperature and the voltage in view of circuit diagram thereof.

Figure 11:
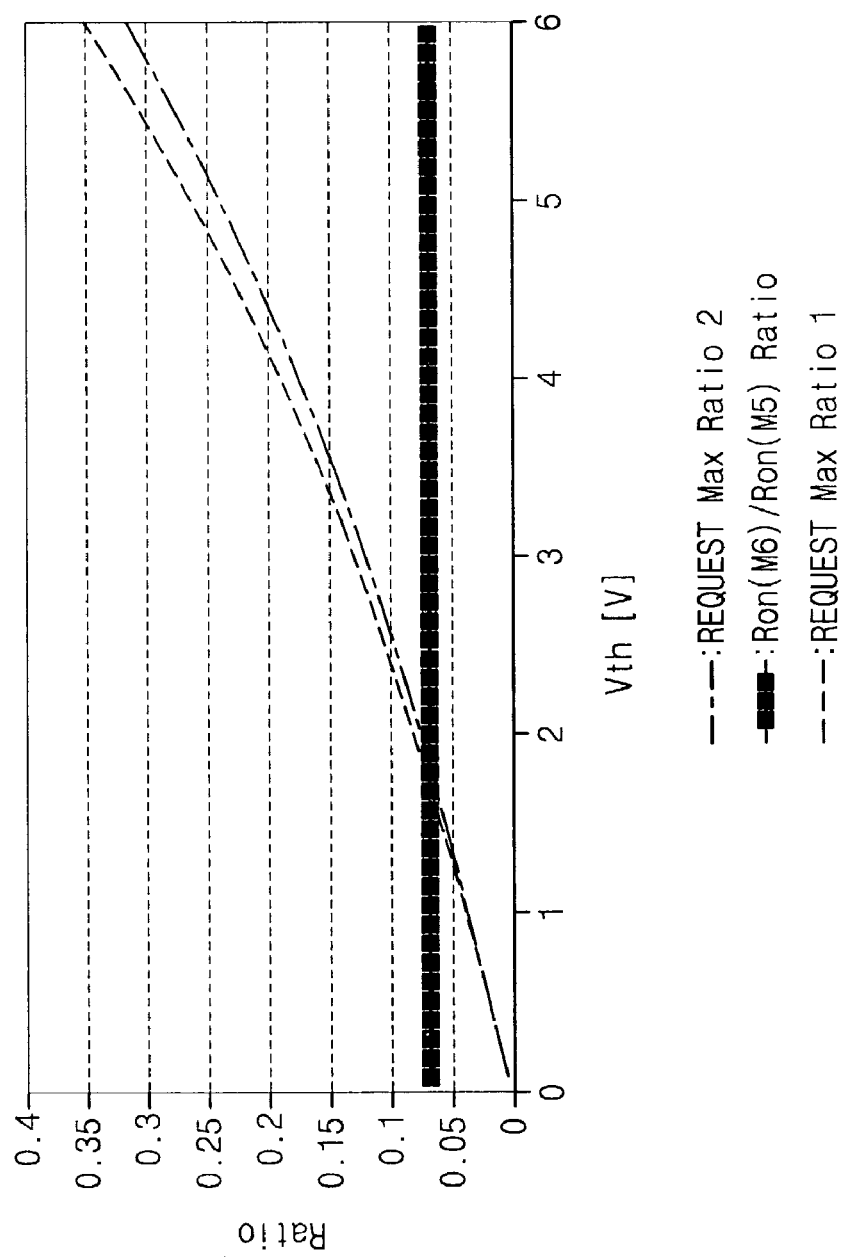
FIG. 11 is a schematic view showing a resistance ratio required when $V_{ON}$ voltage increases.

FIG. 11 is a schematic view showing a resistance ratio required when $V_{ON}$ voltage increases.

Referring to FIG. 11, in a case where the second power voltage $V_{ON}$ increases from 22 volts to 24 volts, the waveform of "REQUEST Max Ratio 2" shows a curve of resistance ratio that is more downwardly shifted than a curve of resistance ratio shown when the second power voltage $V_{ON}$ is 22 volts. Accordingly, although the sixth and seventh transistors M6 and M7 have the same threshold voltage, the shift resister 170 may be misoperated due to the second power voltage $V_{ON}$. That is, the shift resister 170 shown in FIG. 7 has the problem of reliability in association with the temperature and the voltage environment.

Meanwhile, the shift resister 170 shown in FIG. 7 has another problem in relation to the life. In the shift resister 170, the inverter has to be designed such that the seventh transistor M7 and the sixth transistor M6 have the resistance ratio $Ron_{(M7)}/Ron_{(M6)}$ of 1:15 while turning on. That is, the seventh transistor M7 performing on/off operations has a size of 15 times as large as the sixth transistor M6 maintaining the turn-on state all the time.

The more the size difference between the sixth and seventh transistors M6 and M7 is large, the reliability of the shift resister 170 is deteriorated.

This is because the current capacity is decided according to the seventh transistor M7, which is operated as a load of the sixth transistor M6 maintaining the turn-on state all the time. Thus, when the seventh transistor M7 is turned off, a leakage current flows through the sixth transistor M6.

That is, the life does not deteriorate in case that the current flows during a short time such as 50 μs at XGA having one flame of 16.7 ms. However, the TFT may be deteriorated when the leakage current flows through the sixth transistor M6 all the time. So, the life of the shift resister 170 shown in FIG. 7 may be deteriorated because the sixth and seventh transistors M6 and M7 have the size greatly different to each other.

The following Table 1 represents a current capacity per unit channel width of 1 μm of the sixth transistor M6 and the seventh transistor M7 under a same temperature condition in case that the channel width ratio of sixth and seventh transistors M6 and M7 is 1:15 under a same voltage condition.

TABLE 1

|  | M7 | M6 |
|---|---|---|
| channel width ratio | 15 | 1 |
| 25° C. | 0.08 nA | 5.78 nA |
| 60° C. | 1.02 nA | 33 nA |

In the shift resister 170 shown in FIG. 7, the first to fifth transistors M1, M2, M3, M4 and M5 have a current capacity similar to that of the seventh transistor M7, and the sixth transistor M6 has a current capacity of 60 times under a normal temperature and 30 times under a high temperature, that is compared with the seventh transistor M7. When the size of seventh transistor M7 increases in order to improve an operation margin of the pull-down driving section 174, which is being operated as the inverter, the difference of current capacity between the sixth and seventh transistors M6 and M7 remarkably increases.

Especially, since the current capacity flowing per unit channel width of a transistor under the high temperature is about 0.99 μA in view of a conventional pixel size of about 30 μm, the transistor is in turn-on state.

If the current of turn-on state flows through the TFT, the current driving ability is deteriorated and the threshold voltage rises because the amorphous thin film characteristic is degraded. Thus, the voltage of $CT2_{high}$ is lowered as represented by the above equation 1, which is not efficient to turn on the second transistor M2 and the fourth transistor M4. As a result, the shift resister for gate driver comprised of a-Si TFT shown in FIG. 7 may be misoperated.

Figure 12A:
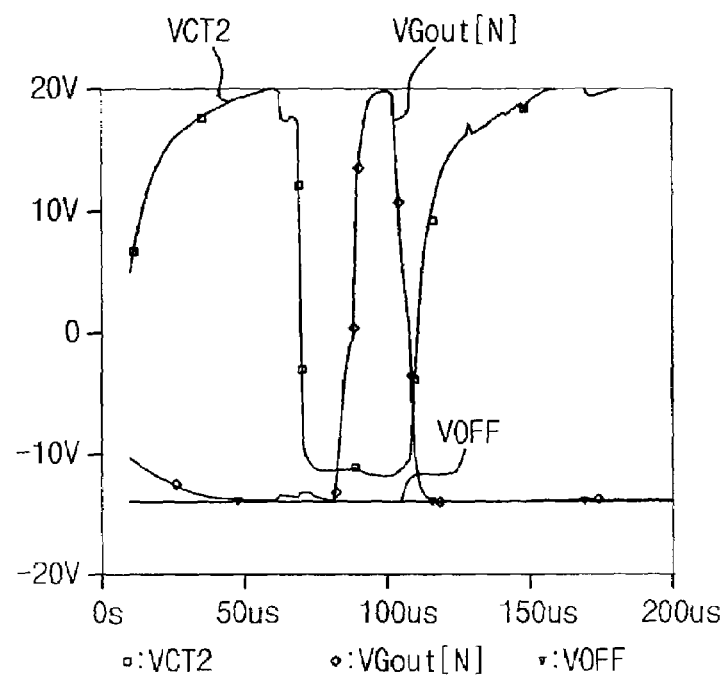
FIGS. 12A and 12B are output waveforms simulated when a sixth transistor is operated in normal or abnormal states, respectively.
Figure 12B:
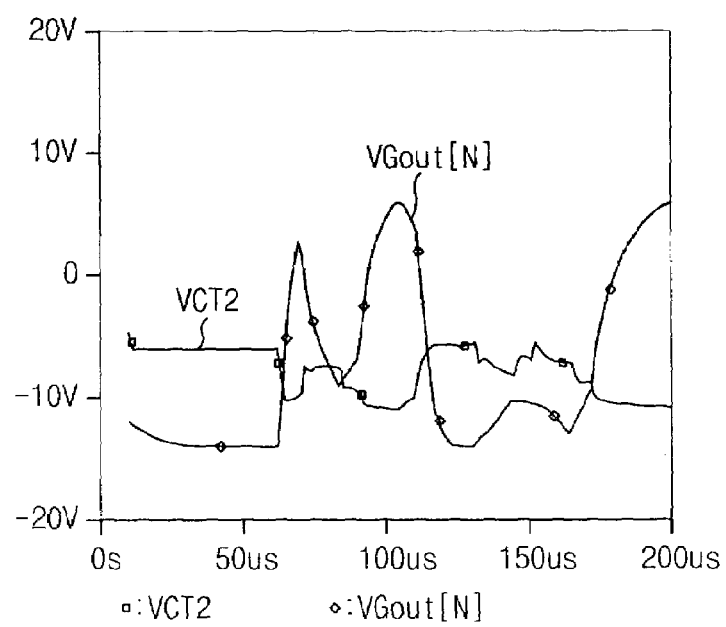

FIGS. 12A and 12B are output waveforms simulated when a sixth transistor M6 is operated in normal or abnormal states, respectively.

As shown in FIG. 12A, when the sixth transistor M6 is in normal state, the output voltage $V_{CT2}$ of the pull-down driving section 174 is enough to turn on the second transistor M2 of the pull-down section 172 or the fourth transistor M4 of the pull-up driving section 173. Therefore, the output waveform of the shift resister 170 is normal.

However, as shown in FIG. 12B, when the sixth transistor M6 is deteriorated, the threshold voltage of the sixth transistor M6 rises and the pull-down driving section 174 is misoperated. Therefore, the output waveform of the shift resister 170 is abnormal.

That is, since the output voltage $V_{CT2}$ of pull-down driving section 174 is not enough to turn on the second transistor M2 of pull-down section 172 or the fourth transistor M4 of pull-up driving section 173, the first power voltage $V_{OFF}$ is not normally applied to the gate line of the LCD apparatus.

As a result, the switching element applied to the LCD panel cannot be normally turned on due to the abnormal waveforms, so that the LCD panel cannot display the image in normal state.

As aforementioned above, the shift resister 170 for gate driver shown in FIG.7 is difficult to be applied to the LCD apparatus due to the reliability thereof in spite of the merits of cost and structure thereof.

In another embodiment of present invention, a shift resister for gate driver that solves the problems, for example, such as reliability, life and the like, of the transistor for gate driver comprised of a-Si TFT will be described.

Figure 13:
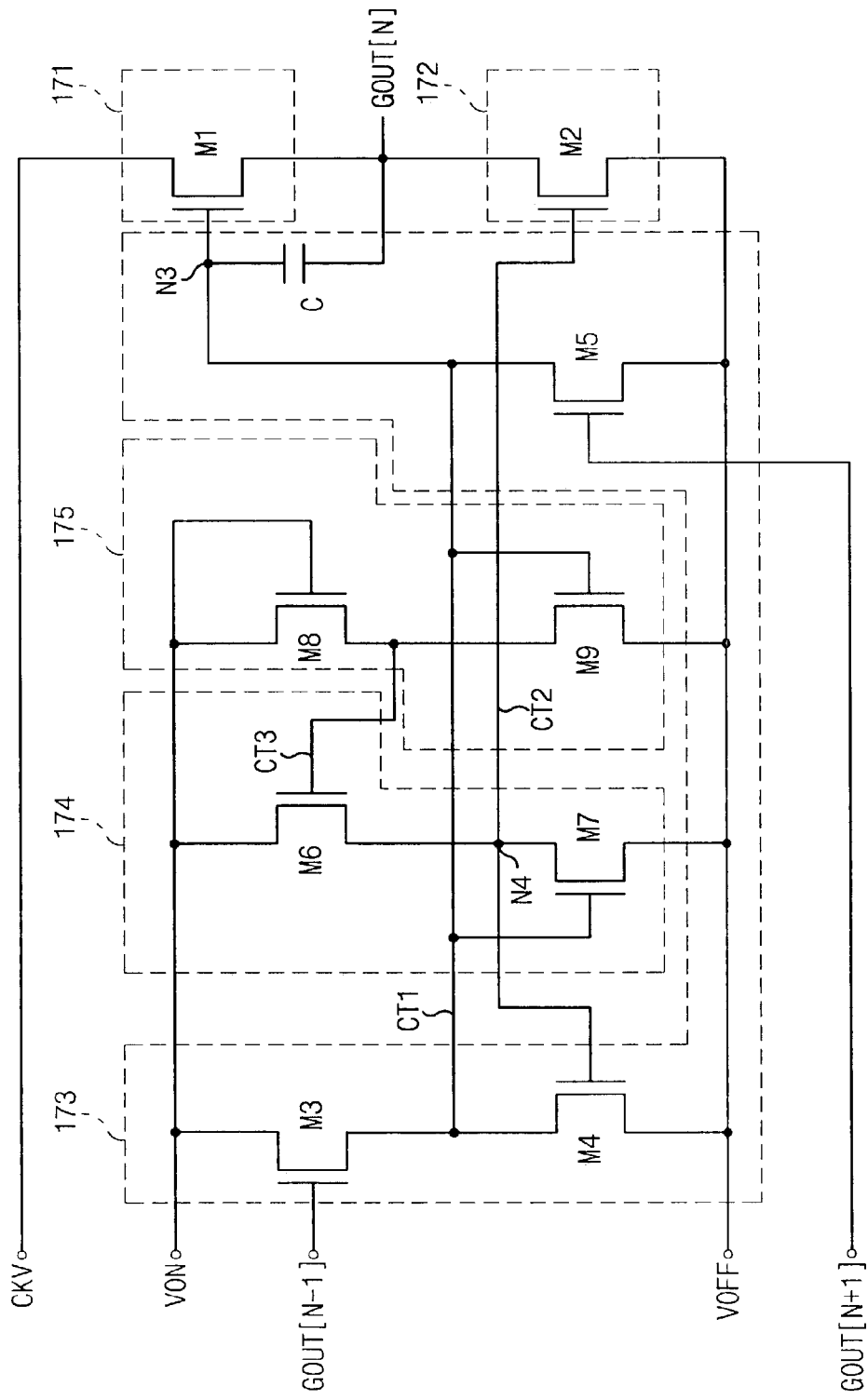
FIG. 13 is a detailed circuit diagram of each stage in a shift register in accordance with another exemplary embodiment of the present invention.

FIG. 13 is a circuit diagram of each stage in the shift register according to another exemplary embodiment of the present invention. Especially, FIG. 13 shows a detailed circuit diagram of each stage in the shift resister shown in FIG. 6.

Referring to FIG. 13, each stage of a shift resister 170 according to another exemplary embodiment of present invention has a pull-up section 171, a pull-down section 172, a pull-up driving section 173, a first pull-down driving section 174 and a second pull-down driving section 175. In the shift resister 170 shown in FIG. 13, parts having function and structure that are the same as those of the shift resister shown in FIG. 7 are allowed to have same reference numerals and the detailed description thereof will be omitted.

The first pull-down driving section 174, that is used as a first inverter, has a sixth transistor M6 and a seventh NMOS transistor. The first pull-down driving section 174 is connected to an input node of the pull-up section 171 and receives a second control signal CT3 from the second pull-down driving section 175 which outputs CT3 in response to the turn-on of pull-up section 171.

The sixth transistor M6 has a drain connected to a second power voltage $V_{ON}$ and a source connected to a fourth node N4. Also, the seventh transistor M7 has a drain connected to the fourth node N4, a gate connected to a third node N3 and a source connected to a first power voltage $V_{OFF}$. The size of sixth transistor M6 is the same as that of the seventh transistor M7. Here, it is preferable that a channel width ratio of the sixth transistor M6 to the seventh transistor M7 is approximately 1:1.

The second pull-down driving section 175 is used as a second inverter for controlling the operation of the first inverter. The second pull-down driving section 175 had an eighth transistor M8 and a ninth transistors M9. The second pull-down driving section 175 is connected to an input node of the pull-down section 172 so as to turn off the pull-down section 172 in responser to a ftont edge of the input signal and turn on the pull-down section 172 in response to the second control signal CT3.

The eighth transistor M8 has a drain and a gate commonly connected to the second power voltage VON, a source connected to a gate of the sixth transistor M6. Also, the ninth transistor M9 has a drain connected to the source of eighth transistor M8, a gate connected to the third node N3 and a source connected to the first power voltage $V_{OFF}$. Here, a size of the ninth transistor M9 is two times than that of the eighth transistor M8. Therefore, it is preferable that a channel length ratio of the eighth transistor M8 to the ninth transistor M9 is approximately 1:2 when a channel width ratio of the eighth transistor M8 to the ninth transistor M9 is 1:1.

As described above, the shift resister comprised of a-Si TFT can be formed by changing the diode structure of the sixth transistor M6 shown in FIG. 7 into a switching structure and employing a separate inverter for controlling the sixth transistor M6.

The shift resister 170 shown in FIG. 13 will be described in detail with reference to various equations.

Assuming that the first pull-down driving section 174 having the sixth transistor M6 and the seventh transistor M7 is the first inverter, the second pull-down driving section 175 having the eighth transistor M8 and the ninth transistor M9 is the second inverter, and the second inverter outputs the output voltage CT3, the relations between a high-level output voltage CT3_high and a low-level output voltage CT3_low of the second inverter and between a high-level output voltage CT3_high and a low-level output voltage CT3_low of the first inverter are represented by the following equations (7) to (10).

$$CT3_{high}=V_{ON}-V_{th(M8)} \tag{7}$$

$$CT3_{high}=[V_{ON}-V_{th(M8)}-V_{OFF}]*Ron_{(M9)}/[Ron_{(M9)}+Ron_{(M8)}]+V_{OFF} \tag{8}$$

$$CT2_{high}=V_{ON}-V_{th(M8)}-V_{th(M6)} \tag{9}$$

$$CT2_{low}=(CT3_{low}-V_{th(M6)}-V_{OFF})*Ron_{(M7)}/[Ron_{(M7)}+Ron_{(M6)}]+V_{OFF} \tag{10}$$

Meanwhile, assuming that the threshold voltage of transistors is "$V_{th}$", the voltage difference between a low-level output voltage $CT2_{low}$ of the first inverter and a source voltage $V_{OFF}$ is lower than the threshold voltage $V_{th}$ of each transistor as represented by the following equation (11). Here, the low-level output voltage $CT2_{low}$ from the first inverter is used as a gate voltage of each transistor so as to turn off the second and fourth transistors M2 and M4.

$$CT2_{low}-V_{OFF}<V_{th} \tag{11}$$

Arranging the above equation (11), the relation between the low-level output voltage $CT2_{low}$ and the source voltage $V_{OFF}$ is represented by the following equation (12).

$$CT2_{low}-V_{OFF}=(CT3_{low}-V_{th}-V_{OFF})*[Ron_{(M7)}/Ron_{(M7)}+Ron_{(M6)}]V_{th} \tag{12}$$

Arranging the above equation (12), the $Ron_{(M7)}/Ron_{(M6)}$ is represented by the following equation (13).

$$Ron_{(M7)}/Ron_{(M6)}V_{th}/(CT3_{low}-2*V_{th}-V_{OFF}) \tag{13}$$

Comparing the equation (13) with the equation (5) corresponding to FIG. 7, it is confirmed that $V_{ON}$ is altered to $CT3_{low}$. Here, If the channel width ratio and the channel length ratio of the eighth transistor M8 to ninth transistor M9 are 1:1 and 3:1, respectively, the equation (5) is represented by the following the equation (14).

$$CT3_{low}=(V_{ON}-V_{th}+V_{OFF})/4 \tag{14}$$

Applying the equation (14) to the equation (13), the equation (14) is represented by the following equation (15).

$$Ron_{(M7)}/Ron_{(M6)}4*V_{th}/(V_{ON}-9*V_{th}-3*V_{OFF}) \tag{15}$$

In the a-Si TFT LCD apparatus, assuming that the first power voltage $V_{OFF}$, the second power voltage $V_{ON}$ and the threshold voltage $V_{th}$ are −7 volts, 22 volts and 1.7 volts, respectively, when the sixth and fifth transistors M6 and M5 are turned on, the resistance ratio between the sixth transistor M6 and the fifth transistor M5 is represented by the following equation (16).

$$Ron_{(M7)}/Ron_{(M6)}4*1.7/[22-9*1.7-3*(-7)]¼ \tag{16}$$

Referring to the above equation (16), the inverter of shift resister for gate driver comprised of the a-Si TFT may have an increased resistance ratio needed in turn-on.

Figure 14:
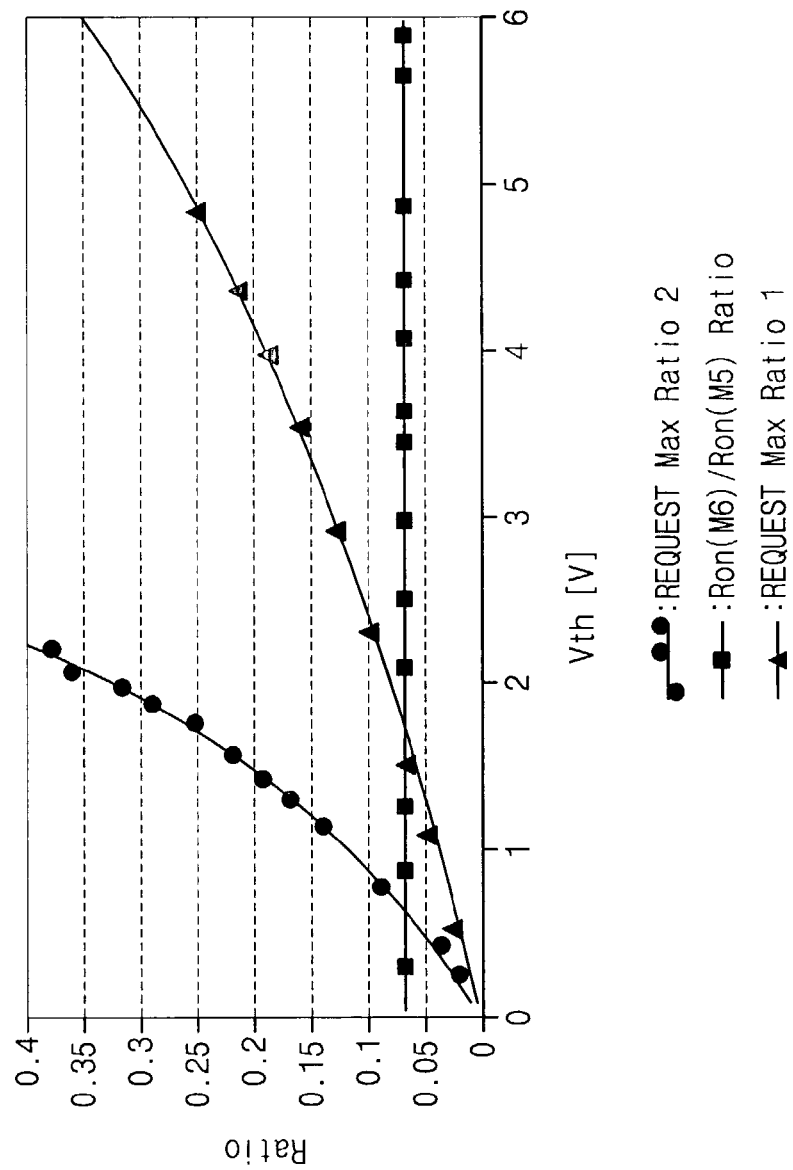
FIG. 14 is a schematic view showing a relation between a size of transistor and a threshold voltage thereof applied to inverters shown in FIGS. 7 and 13.

FIG. 14 is a schematic view showing a first relation between a size of transistor and a threshold voltage thereof applied to the inverter shown in FIG. 7 and a second relation between a size of transistor and a threshold voltage thereof applied to the inverter shown in FIG. 13. Here, "REQUEST Max Ratio 1" is a curve according to the first relation between the size of transistor applied to the inverter shown in FIG.7 and the threshold voltage thereof and "REQUEST Max Ratio 2" is a curve according to the second relation between the size of transistor applied to inverter and the threshold voltage according to the present invention.

Referring to FIG. 14, in a case where TFTs have a same size each other, the threshold voltage margin increases in a normal operation state.

However, since the voltage Vgs6 that the sixth transistor M6 turns on is almost equal to the voltage Vgs7 (=$V_{ON}$−$V_{OFF}$) and the gate voltage applied to the sixth transistor M6 is substantially equal to CT3_low, so the voltage Vgs6 of the present invention is represented by the following equation (17).

$$Vgs6=CT3_{low}-V_{OFF}=(V_{ON}-V_{th}+V_{OFF})/2-V_{OFF}(V_{ON}-V_{OFF})/2 \tag{17}$$

In the above equation (17), the threshold voltage $V_{th}$ is disregarded because the threshold voltage is relatively small to $V_{ON}$−$V_{OFF}$.

The "CT1" bootstrapped by the power clock having amplitude of $V_{ON}$−$V_{OFF}$ is equal to $V_{ON}$+($V_{ON}$−$V_{OFF}$), so the voltage Vgs7 is represented by the following equation (18).

$$Vgs7 = CT1 - V_{OFF} = 2*(V_{ON} - V_{OFF}) \quad (18)$$

That is, in the circuit diagram according to another exemplary embodiment of present invention, the ratio of Vgs6 to Vgs7 is approximately 1:4.

With comparing the current capacities of the sixth and seventh transistors M6 and M7 to each other when the sixth and seventh transistors M6 and M7 are simultaneously turned on by using a current equation of the TFT saturation area as represented by the following equation (19), the current capacities are represented by the following equation (20) (i.e. on the assumption that Vgs >> $V_{th}$).

$$Ids = [W*\mu*(Vgs-V_{th})^2]/(2*L) \quad (19)$$

$$Ids7/Ids6 = 8*W_{(M7)}/W_{(M6)} \quad (20)$$

That is, although the channel widths of the sixth and seventh transistors M6 and M7 are the same, the resistance ratio between the sixth and seventh transistors M6 and M7 is 8 in equivalence when the sixth and seventh transistors M6 and M7 are simultaneously turned on.

As a result, although the channel widths of the sixth and seventh transistors M6 and M7 are the same, the resistance ratio between the sixth and seventh transistors M6 and M7 may be less than $Ron_{(M7)}/Ron_{(M6)}$ required in the above equation (16), as represented by the following equation (21).

$$Ron_{(M7)}/Ron_{(M6)} = 1/8 \cdot 1/6 \quad (21)$$

As aforementioned above, in another exemplary embodiment of the present invention, the channel width difference between the sixth transistor M6 and the seventh transistor M7 applied to the inverter may be reduced. Also, the present invention may prevent the flow of an overcurrent through the sixth transistor M6, which is being operated at a high temperature, thereby preventing the transistor from being deteriorated.

Figure 15:
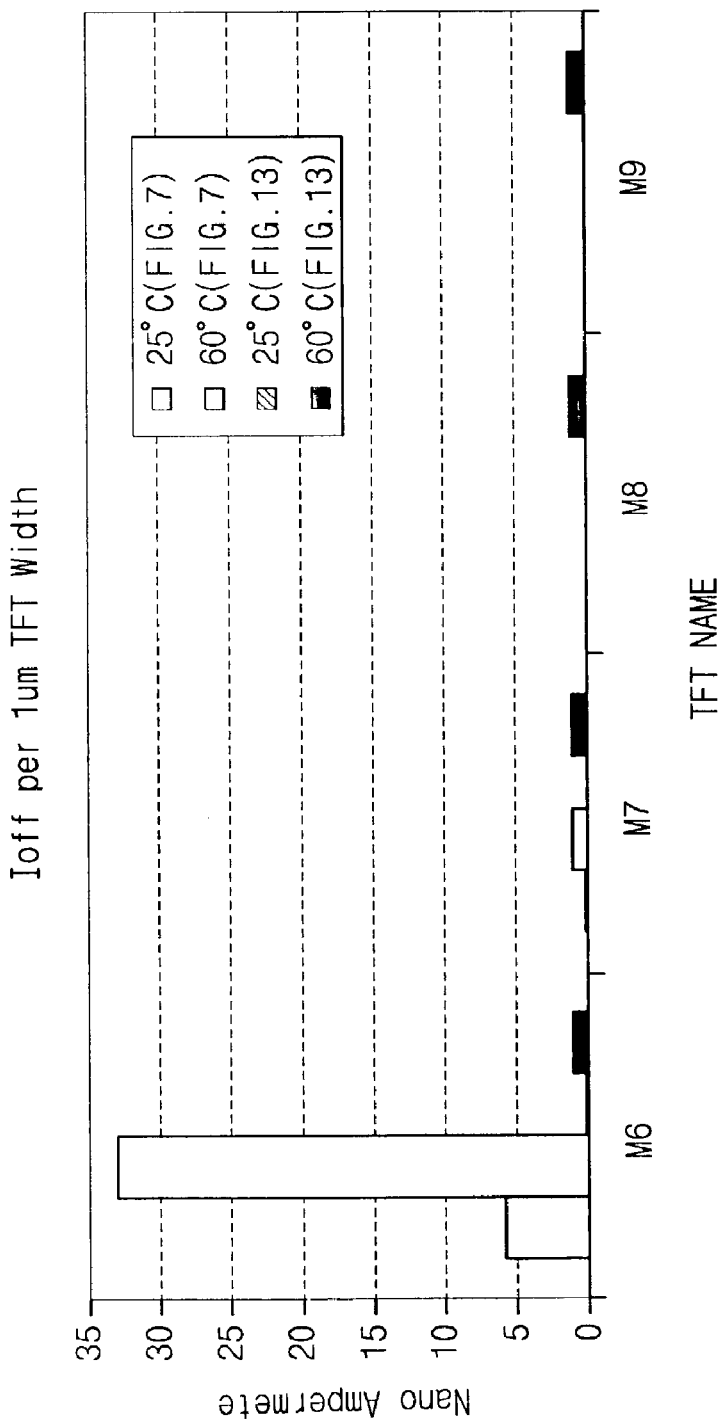
FIG. 15 is a schematic view showing the current quantity when channel widths of transistor applied to the inverters shown in FIGS. 7 and 13 are the same.

The following Table 2 and FIG. 15 represent the simulated result of the current capacity flowing per unit width 1 μm, when the channel width of the sixth transistor M6 and the seventh transistor M7 applied to the first inverter and the channel width of the eighth transistor M8 and the ninth transistor M9 applied to the second inverter are the same.

TABLE 2

| TFT | Result of FIG. 7 | | Result of the present invention | | | |
|---|---|---|---|---|---|---|
| | M6 | M7 | M6 | M7 | M8 | M9 |
| W Ratio | $W_{(M7)}/W_{(M6)}$ = 15 | | $W_{(M7)}/W_{(M6)}$ = 1 | | $W_{(M9)}/W_{(M8)}$ = 1 | |
| L Ratio | $L_{(M7)}/L_{(M6)}$ = 1 | | $L_{(M7)}/L_{(M6)}$ = 1 | | $L_{(M9)}/L_{(M8)}$ = 1 | |
| 25° C. | 5.78 nA | 0.08 nA | 0.12 nA | 0.07 nA | 0.017 nA | 0.016 nA |
| 60° C. | 33 nA | 1.02 nA | 1.16 nA | 1.11 nA | 1.26 nA | 1.25 nA |

As shown in Table 2 and FIG. 15, since the leakage current value of all transistors operated in high temperature may be lowered below about 1 nA, the deterioration of the transistors may be prevented as shown in FIG. 7 due to the leakage current of about 33 nA.

As aforementioned above, the problems, for example, such as reliability, life, sensitivity with respect to the temperature and voltage, etc., of the shift resister for gate driver comprised of a-Si TFT shown in FIG. 7 may be overcome through the shift resister shown in FIG. 13 according to another exemplary embodiment of the present invention.

Although exemplary embodiments of the invention have been described, it will be understood by those skilled in the art that the present invention should not be limited to the described preferred embodiment, but various changes and modifications can be made within the spirit and scope of the invention as defined by the appended claims.

What is claimed is:

1. A shift register in which a plurality of stages are connected one after another to each other, the stages having a first stage in which a start signal is coupled to an input terminal of the first stage, the shift register sequentially outputting output signals of each of the stages, each of the stages receiving one of a plurality of clock signals and a plurality of control signals, the one of the plurality of control signals controlling output of said one of the plurality of clock signals, each of the stages comprising:
   a pull-up section to provide said one of the plurality clock signals to an output terminal;
   a pull-up driving section to turn on the pull-up section in response to a front edge of an output signal of one of previous stages and to turn off the pull-up section in response to a front edge of said one of the plurality of control signals;
   a pull-down section to provide a first power voltage to the output terminal;
   a first pull-down driving section to output a second control signal in response to turn-on of the pull-up section; and
   a second pull-down driving section to turn off the pull-down section in response to a front edge of an input signal and to turn on the pull-down section in response to the second control signal.

2. The shift register of claim 1, wherein the pull-up driving section comprises:
   a capacitor connected between the input node of the pull-up section and the output terminal;
   a first transistor of which a first current electrode is coupled to a second power voltage node, a control electrode coupled to the input terminal, and a second current electrode is coupled to the input node of the pull-up section;
   a second transistor of which a first current electrode coupled to the input node of the pull-up section, a control electrode is coupled to the input node of the pull-down section and a second current electrode is coupled to the first power voltage; and
   a third transistor of which a first current electrode coupled to the input node of the pull-up section, a control electrode is coupled to an output terminal of one of next stages and a second current electrode is coupled to the first power voltage node.

3. The shift register of claim 1, wherein the first pull-down driving section comprises:
   a first transistor of which a first current electrode and a control electrode are commonly coupled to a second power voltage node;
   a second transistor of which a first current electrode is coupled to a second electrode of the fourth transistor, a control electrode is coupled to the input signal, and a second current electrode is coupled to the first power voltage node.

4. The shift register of claim 3, wherein a channel width ratio of the first transistor to the second transistor is approximately 1:1 and a channel length ratio of the fourth transistor to the fifth transistor is approximately 1:2.

5. The shift register of claim 1, wherein the second pull-down driving section comprises;

a third transistor of which a first current electrode is coupled to a second power voltage node, a control electrode is coupled to an output signal of the first pull-down driving section and a second current electrode is coupled to the input node of the pull-down section; and a fourth transistor of which a first current electrode is coupled to the input node of the pull-down section, a control electrode is coupled to the input signal and a second current electrode is coupled to the first power voltage node.

6. The shift register of claim 5, wherein a channel width ratio of the third transistor to the fourth transistor is approximately 1:1.

7. A display device comprising a display cell array circuit, a scan driving circuit formed on a substrate, the display cell array circuit comprising a plurality of data lines and a plurality of gate lines, each of the display cell arrays coupled to a corresponding pair of data line and gate line, the scan driving circuit comprising a shift register including a plurality of stages coupled one after another to each other, the stages having a first stage in which a start signal is coupled to an input terminal, for sequentially outputting output signals of respective stages, each of the stages receiving one of a plurality of clock signals and one of a plurality of control signals, the one of the plurality of control signals controlling output of said one of the plurality of clock signals, wherein each of the stages comprises:

a pull-up section to provide said one of the plurality of clock signals to an output terminal;

a pull-up driving section to turn on the pull-up section in response to a front edge of an output signal of one of previous stages and to turn off the pull-up section in response to a front edge of the said one of the plurality of control signals;

a pull-down section to provide a first power voltage to the output terminal;

a first pull-down driving section to a second control signal in response to turn-on of the pull-up section;

a second pull-down driving section to turn off the pull-down section in response to a previous a edges of an input signal and to turn on the pull-down section in response to the second control signal.

8. The shift register of claim 1, wherein odd numbered stages respectively receive a first clock signal and even numbered stages respectively received a second clock signal having a phase opposite to the first clock signal.

9. The shift register of claim 1, wherein the pull-up driving section is coupled to an input node of the pull-up section.

10. The shift register of claim 1, wherein the first pull-down driving section is coupled to an input node of the pull-up section.

11. The shift register of claim 1, wherein the second pull-down driving section is coupled to an input node of the pull-down section.

12. A scan driver in which a plurality of stages are connected one after another to each other, the stages having a first stage in which a start signal is coupled to an input terminal of the first stage, the shift register sequentially outputting output signals of each of the stages, each of the stages receiving one of a plurality of clock signals and one of a plurality of controls signals, the one of the plurality of control signals controlling output of said one of plurality of the clock signals, each of the stages comprising:

a pull-up section to f provide said one of the plurality of clock signals to an output terminal;

a pull-up driving section to turn on the pull-up section in response to a front edge of an output signal of one of previous stages and to turn off the pull-up section in response to a front edge of said one of the plurality of control signals;

a pull-down section to provide a first power voltage to the output terminal;

a first pull-down driving section to output a second control signal in response to turn-on of the pull-up section; and a second pull-down driving section to turn off the pull-down section in response to a front edge of an input signal and to turn on the pull-down section in response to the second control signal.

13. The scan driver of claim 12, wherein odd numbered stages respectively receive a first clock signal and even numbered stages respectively received a second clock signal having a phase opposite to the first clock signal.

14. The shift register of claim 12, wherein the pull-up driving section comprises:

a capacitor connected between the input node of the pull-up section and the output terminal;

a first transistor of which a first current electrode is coupled to a second power voltage node, a control electrode coupled to the input terminal, and a second current electrode is coupled to the input node of the pull-up section;

a second transistor of which a first current electrode is coupled to the input node of the pull-up section, a control electrode is coupled to the input node of the pull-down section and a second current electrode is coupled to the first power voltage; and a third transistor of which a first current electrode is coupled to the input node of the pull-up section, a control electrode is coupled to an output terminal of one of next stages and a second current electrode is coupled to the first power voltage.

15. The scan driver of claim 12, wherein the first pull-down driving section comprises:

a first transistor of which a first current electrode and a control electrode are commonly coupled to a second power voltage node;

a second transistor of which a first current electrode is coupled to a second electrode of the fourth transistor, a control electrode is coupled to the input signal, and a second current electrode is coupled to the first power voltage node.

16. The scan driver of claim 15, wherein a channel width ratio of the first transistor to the second transistor is approximately 1:1 and a channel length ratio of the fourth transistor to the fifth transistor is approximately 1:2.

17. The shift register of claim 15, wherein the second pull-down driving section comprises:

a third transistor of which a first current electrode is coupled to a second power voltage node, a control electrode is coupled to an output signal of the first pull-down driving section and a second current electrode is coupled to the input node of the pull-down section; and a fourth transistor of which a first current electrode is coupled to the input node of the pull-down section, a control electrode is coupled to the input signal and a second current electrode is coupled to the first power voltage node.

18. The scan driver of claim 17, wherein a channel width ratio of the third transistor to the fourth transistor is approximately 1:1.

19. The display device of claim 7, wherein odd numbered stages respectively received a first clock signal and even numbered stages respectively received a second clock signal having a phase opposite to the first clock signal.

20. The display device of claim 7, wherein the pull-up driving section is coupled to an input node of the pull-up section, the first pull-down driving section is coupled to an input node of the pull-up section, and the second pull-down driving section is coupled to an input node of the pull-down section.

* * * * *